(12) United States Patent
Daniel et al.

(10) Patent No.: US 9,041,123 B2
(45) Date of Patent: May 26, 2015

(54) THIN FILM TRANSISTORS AND HIGH FILL FACTOR PIXEL CIRCUITS AND METHODS FOR FORMING SAME

(71) Applicant: Palo Alto Research Center Incorporated, Palo Alto, CA (US)

(72) Inventors: Jurgen H. Daniel, Washington, DC (US); Ana Claudia Arias, Los Gatos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/147,860

(22) Filed: Jan. 6, 2014

(65) Prior Publication Data

US 2014/0117448 A1    May 1, 2014

Related U.S. Application Data

(62) Division of application No. 12/324,207, filed on Nov. 26, 2008, now Pat. No. 8,624,330.

(51) Int. Cl.
*H01L 29/66* (2006.01)
*H01L 29/51* (2006.01)
*H01L 51/05* (2006.01)
*H01L 29/786* (2006.01)

(52) U.S. Cl.
CPC ............ *H01L 29/51* (2013.01); *H01L 51/0529* (2013.01); *H01L 29/786* (2013.01)

(58) Field of Classification Search
CPC .... H01L 51/0529; H01L 29/51; H01L 29/786

USPC ............. 257/66, 72, E21.414, E27.111, 257/E29.273, 386
See application file for complete search history.

(56) References Cited

U.S. PATENT DOCUMENTS

| | | |
|---|---|---|
| 5,574,294 A | 11/1996 | Shepard |
| 6,274,412 B1 | 8/2001 | Kydd et al. |
| 6,380,011 B1 | 4/2002 | Yamazaki et al. |
| 7,151,275 B2 | 12/2006 | Klauk et al. |
| 7,189,663 B2 | 3/2007 | Bao et al. |
| 7,557,891 B2 | 7/2009 | Yoon |
| 7,675,067 B2 | 3/2010 | Song et al. |

(Continued)

OTHER PUBLICATIONS

A Salleo et al., "Polymer thin-film transistors with chemically modified dielectric interfaces," Applied Physics Letters, vol. 81, No. 23, pp. 4383-4385, Dec. 2, 2002.

(Continued)

*Primary Examiner* — Benjamin Sandvik
*Assistant Examiner* — Farid Khan
(74) *Attorney, Agent, or Firm* — Fay Sharpe LLP

(57) ABSTRACT

A method and structures to achieve improved TFTs and high fill-factor pixel circuits are provided. This system relies on the fact that jet-printed lines have print accuracy, which means the location and the definition of the printed lines and dots is high. The edge of a printed line is well defined if the printing conditions are optimized. This technique utilizes the accurate definition and placement of the edges of printed lines of conductors and insulators to define small features and improved structures.

7 Claims, 7 Drawing Sheets

(56) References Cited

U.S. PATENT DOCUMENTS

| | | |
|---|---|---|
| 2006/0060855 A1* | 3/2006 | Lee et al. .................. 257/59 |
| 2006/0148167 A1 | 7/2006 | Brown et al. |
| 2006/0273303 A1 | 12/2006 | Wu et al. |
| 2007/0066080 A1 | 3/2007 | Kugler et al. |
| 2007/0158644 A1 | 7/2007 | Chabinye et al. |
| 2009/0166612 A1* | 7/2009 | Cain et al. .................. 257/40 |
| 2010/0006826 A1 | 1/2010 | Dimmler |
| 2010/0127269 A1 | 5/2010 | Daniel et al. |
| 2010/0127271 A1 | 5/2010 | Daniel et al. |

OTHER PUBLICATIONS

Ping Liu et al., "Enabling Gate Dielectric Designe for All Solution-Processed, High-Performance Flexible Organic Thin-Film Transistors," J. Am. Chem. Soc., 128, pp. 4554-4555, 2006.

Garciella B. Blanchet et al., "Contact resistance in organic thin film transistors," Applied Physics Letters, vol. 84, No. 2, pp. 296-298, Jan. 12, 2004.

Ioannis Kymissis et al., "High-Performance Bottom Electrode Organic Thin-Film Transistors," IEEE Transactions on Electron Devices, vol. 48, No. 6, pp. 1060-1064, Jun. 2001.

\* cited by examiner

THIN FILM TRANSISTORS AND HIGH FILL FACTOR PIXEL CIRCUITS AND METHODS FOR FORMING SAME

CROSS REFERENCES TO RELATED APPLICATIONS

This application is a divisional of, and claims priority to, co-pending U.S. application Ser. No. 12/324,207, filed Nov. 26, 2008 (to issue as U.S. Pat. No. 8,624,330 on Jan. 7, 2014), which is hereby incorporated herein by reference.

This application is related to U.S. application Ser. No. 12/324,304, filed on Nov. 26, 2008, entitled, "An Electronic Circuit Structure and Method for Forming Same," and naming Daniel et al. as inventors and U.S. application Ser. No. 12/324,250, filed on Nov. 26, 2008, entitled "Method and Structure for Establishing Contacts in Thin Film Transistor Devices," naming Daniel et al. as inventors.

BACKGROUND

When printing electronic features using inkjet printing, the width of printed lines of the features often impacts the performance of the resulting device. In thin-film-transistors (TFTs), the line width of conductors impacts the size and parasitic capacitances of the transistor. High capacitances, e.g. gate-source or gate-drain capacitances, negatively impact the switching speed of TFTs. In active-matrix pixel circuits, high parasitic capacitances can lead to high feedthrough voltages. Moreover, in pixel circuits, the fill-factor of a pixel is negatively affected by wide data bus lines.

It is thus advantageous to minimize the width of printed lines in such environments. However, the line width is usually determined by the ejected fluid, the aperture of the print head nozzle and the applied waveform (in the case of a piezoelectric print head)—all of which have a practical limit of adjustment. So, the lines can only be minimized to a limited degree—which may not be sufficient for some applications.

More particularly, FIG. 1 shows an illustration of a conventional printed TFT 10 (bottom-gate configuration in cross-section). A source 12, gate 14, drain 16, gate dielectric 17 and semiconductor 18 comprise the transistor 10—which is formed on a substrate 20.

As shown, the width of the gate 14 is fixed (determined by the printing process) and, thus, is a limitation on the configuration. The source 12 and drain 16 have a certain overlap 13, 15 with the gate 14. Since a small channel width is generally desirable, this overlap 13, 15 can be large, causing significant parasitic capacitance.

An active-matrix pixel circuit 30 is shown in FIG. 2. As shown, jet-printed features, such as data (or source) line(s) 32 and gate line(s) 34 are limited by the size (e.g. width) of the printed lines. Also, FIG. 2 clearly shows that the fill-factor (area of the drain or pixel pad(s) 36 divided by the total pixel area) in such pixel circuits is limited by the width of the printed lines. In an embodiment such as that shown in FIG. 2, a typical pixel pitch may be approximately 680 microns with 60 micron wide data and gate lines, resulting in a fill factor of about 70%. For smaller pixel sizes the fill factor decreases, which is a problem. A high fill-factor is desirable for image sensors and displays. For example, wide data lines, such as data lines 32, pose a problem in displays because the varying voltage potential on the data lines can affect the display media and degrade the image. Moreover, the overlap of the gate lines, such as gate line 34, with pixel pads, such as pixel pad 36, can cause a substantial feedthrough voltage. As noted in connection with FIG. 1, a large overlap of the source and drain with the gate in a TFT is generally undesirable because of the parasitic capacitance.

INCORPORATION BY REFERENCE

U.S. application Ser. No. 12/324,304, filed on Nov. 26, 2008, entitled, "An Electronic Circuit Structure and Method for Forming Same," and naming Daniel et al. as inventors and U.S. application Ser. No. 12/324,250, filed on Nov. 26, 2008, entitled "Method and Structure for Establishing Contacts in Thin Film Transistor Devices," naming Daniel et al. as inventors are incorporated herein in their entirety by this reference.

BRIEF DESCRIPTION

In one aspect of the presently described embodiments, a thin film transistor comprises a substrate, a gate electrode pattern formed on the substrate, a gate dielectric formed over the gate electrode, a drain electrode pattern formed over at least a part of the gate pattern, a decoupling insulating pattern formed over at least part of the gate pattern the insulating pattern formed at a first distance to the drain electrode, a source electrode pattern formed on at least part of the decoupling insulating pattern and extending over the gate pattern to be positioned at a second distance to the drain electrode; and, a semiconductor material disposed over at least part of the source, drain and gate electrode pattern.

In another aspect of the presently described embodiments, the gate pattern is printed.

In another aspect of the presently described embodiments, the source pattern is printed.

In another aspect of the presently described embodiments, the drain pattern is printed.

In another aspect of the presently described embodiments, the decoupling insulating pattern is printed.

In another aspect of the presently described embodiments, the decoupling insulating patter comprises at least one of an SU-8 material, polyvinylphenol (PVP), a low dielectric constant material, a phase change material, stearyl stearamide, radiation curable gel inks, radiation curable polymers, polymer dielectrics, and composite dielectrics.

In another aspect of the presently described embodiments, a thin film transistor comprises a substrate, a source pattern and a drain pattern with a semiconductor positioned between the source pattern and the drain pattern on the substrate, a dielectric layer formed over source and drain electrode pattern and semiconductor, a decoupling insulating pattern formed over at least portions of the drain and source patterns, and, a gate electrode pattern between the source pattern, the drain pattern, the semiconductor material and the decoupling insulating pattern.

In another aspect of the presently described embodiments, the gate pattern is printed.

In another aspect of the presently described embodiments, the source pattern is printed.

In another aspect of the presently described embodiments, the drain pattern is printed.

In another aspect of the presently described embodiments, the decoupling insulating pattern is printed.

In another aspect of the presently described embodiments, the decoupling insulating pattern comprises at least one of an SU-8 material, polyvinylphenol (PVP), a low dielectric constant material, a phase change material, stearyl stearamide, radiation curable gel inks, radiation curable polymers, polymer dielectrics, and composite dielectrics.

In another aspect of the presently described embodiments, a pixel circuit comprises a substrate, a gate pattern having a plurality of gate lines disposed in a first direction on the substrate, a plurality of data lines disposed in a second direction and intersecting the gate lines, a plurality of decoupling insulating regions disposed on selected regions of the gate pattern and selected regions of the data lines, and, a plurality of pixel pads disposed on selected second portions of the gate pattern and selected portions of the decoupling insulating pattern whereby positioning the pixel pads only on the gate pattern and the decoupling insulating pattern increases an effective area for the pixel pad.

In another aspect of the presently described embodiments, the circuit further comprises at least one thin film transistor.

In another aspect of the presently described embodiments, the thin film transistor comprises a selected third portion of the gate pattern, a selected second portion of the data lines, a selected portion of a pixel pad, and, semiconductor material disposed to connect the selected third portion of the gate pattern, the selected second portion of the data lines, and the selected portion of the pixel pad.

In another aspect of the presently described embodiments, the circuit further comprises an insulating layer between a selected fourth portion of the gate pattern and the selected second portion of the data lines.

In another aspect of the presently described embodiments, the circuit further comprises insulating pads formed at intersections of gate lines and data lines.

In another aspect of the presently described embodiments, the first direction is generally perpendicular to the second direction.

In another aspect of the presently described embodiments, a method for forming a circuit comprises printing a gate pattern on a substrate, printing a drain pattern, the drain pattern overlapping selected first regions of the gate pattern, printing a decoupling insulating pattern, the decoupling insulating pattern overlapping selected second regions of the gate pattern, and, printing a source pattern on the polymer pattern.

In another aspect of the presently described embodiments, the method further comprises forming a semiconductor on the circuit.

DETAILED DESCRIPTION

The presently described embodiments relate to a method and structures to achieve improved TFTs and high fill-factor active-matrix pixel circuits. The concept relies on the fact that jet-printed lines of electrically conducting material may be relatively wide as a result of various limitations including drop-size and the liquid-surface interaction. However, print accuracy of jet-printed lines, e.g. the location and the definition of the printed lines and dots, is high. The edge of a printed line is well defined if the printing conditions are optimized. This technique utilizes the accurate definition and placement of the edges of printed lines of conductors and insulators to define small features and improved structures.

It should be appreciated that this technique allows patterning of higher performing transistors. Moreover, improved high fill-factor active-matrix pixel arrays for displays, image sensors and other sensor arrays will be achieved.

Figure 1:
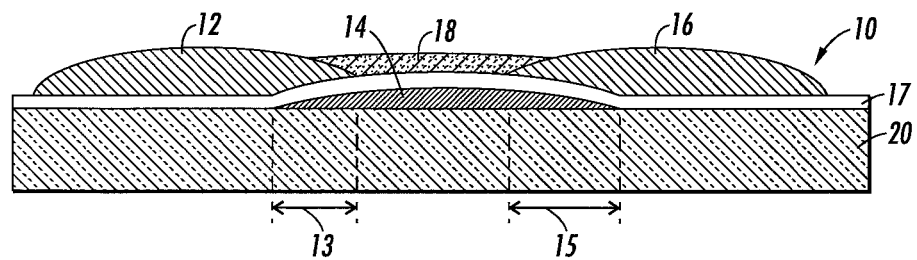
FIG. 1 is a cross-sectional view of a convention thin film transistor.
Figure 2:
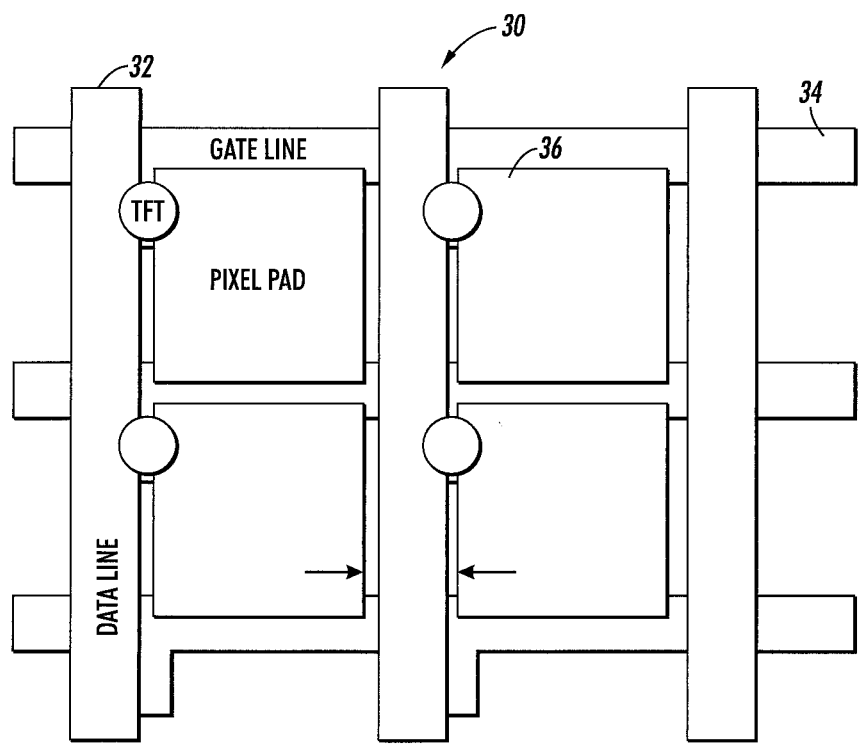
FIG. 2 is a graphic representation of a conventional pixel circuit.
Figure 3:
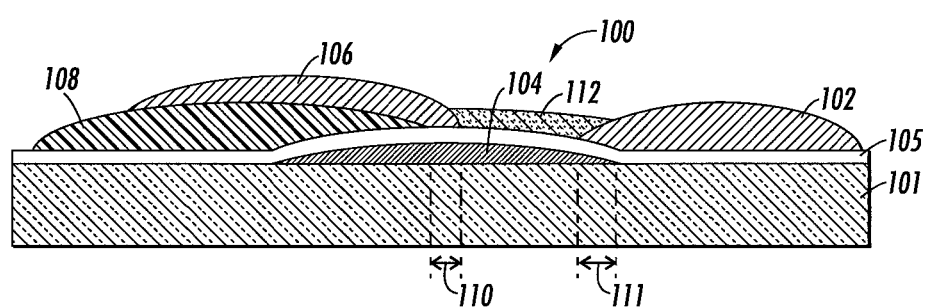
FIGS. 3, 4, 5 and 6 are cross-sectional views of a thin film transistor according to the presently described embodiments.

With reference to FIG. 3, a transistor 100 is shown in a bottom-gate configuration. In one form, the transistor 100 is a printed thin film transistor formed of any of a variety of suitable, printable materials. As shown in FIG. 3, the transistor 100 is formed on a substrate 101. In this embodiment, a drain pad or area 102 is printed or patterned as close as possible to one edge of a gate line or area or pattern (e.g. a gate electrode) 104 on a gate dielectric or pattern 105. In at least one form, this is possible with high accuracy (e.g. 5 microns) using any of a variety of jetting and/or printing devices. The electrically conducting material for the gate, source and drain may be a solution deposited conducting polymer such as PEDOT:PSS, polyaniline, etc., or solution deposited metal nanoparticles (such as silver nanoparticles which may be subsequently sintered), conducting nanotubes (e.g. carbon nanotubes), nanowires (e.g. metal nanowires), conductive oxides (e.g. indium tin oxide nanoparticles), mixtures of organic conductors and inorganic conducting nanoparticles, conductors deposited from precursors for conducting electrodes such as silver salts, etc. The insulating layer that forms the gate dielectric 105 may be deposited from a solution by jet-printing, doctor-blading, spin-coating, slot-coating, Langmuir-Blodgett, spray coating or other common solution deposition methods. This layer is typically thin in order to obtain a high specific capacitance. The layer may be as thin as a few nanometers up to several micrometers and typically several hundred nm. The gate dielectric 105 may comprise materials such as self assembled monolayers, polymer dielectrics or composite or multilayer dielectrics. Examples of materials are polyvinylphenol (PVP), polyvinylcinnamate, polystyrene, polyvinylalcohol (PVA), fluorinated polymers such as CYTOP (from Asahi Glass), epoxy-based polymers such as SU-8 (MicroChem, Corp.), polysilsesquioxanes, polyimide, PMMA, composites of polymer with titania nanoparticles, etc. The gate dielectric 105 may also be deposited by non-solution processes, such as thermal evaporation, atomic layer deposition (ALD), chemical vapor deposition (CVD), lamination, etc. In one example, the gate dielectric comprises ALD deposited aluminum oxide or hafnium oxide. In another example it comprises evaporated Parylene. Although the main focus is on printing methods, the gate electrode may be deposited and patterned by more conventional methods such as sputtering or evaporation followed by photolithography and etching techniques such as wet chemical etching. The gate electrode may be also patterned using laser ablation or laser deposition. Moreover, the gate electrode or gate electrode level may be patterned by shadow mask evaporation. The gate electrode level may be also deposited by electroplating or electroless plating. The gate dielectric may be also grown directly on the gate metal by oxidation or by anodization methods. Particularly when using a metal such as aluminum or tantalum, good dielectric layers are formed through oxidation or anodization (aluminum oxide or tantalum oxide).

As noted above, in a conventional method, in order to keep a small channel length (the gap between source electrode and drain electrode defines the transistor channel), the overlap of a source line or area or pattern 106 with the gate line 104 would typically be large, resulting in a high source-gate parasitic capacitance. Here, to reduce this parasitic capacitance, a decoupling insulator or decoupling insulating pattern 108 is printed onto a region of the gate line 104 over the gate dielectric 105. So, the direct overlap in the area where only the thin gate dielectric layer 105 is present, as shown at 110 and 111, is relatively narrow. The decoupling insulator 108 is, in one form, substantially thicker than the gate dielectric 105 and it serves to electrically decouple (e.g. lower the capacitance between) the source line 106 and the gate line 104. The printed decoupling insulator 108 could take a variety of forms, including a printed UV curable polymer or any other dielectric material. In one example, the polymer is formed of the epoxy polymer SU-8 (MicroChem Corp.) material and jet-printed from a solution of SU-8 in gammabutyrol-lactone. In another example, the polymer is PVP (polyvinylphenol) jet-printed from a solution of PVP in propylene glycol methyl ether acetate (PGMEA). In a third example the material is a radiation curable material such as polyvinylcinnamate or one of the HexiJet UV curable inkjet inks from Hexion Speciality Chemicals, Inc. Low dielectric constant (low-k) polymers, such as Cytop (Asahi Glass), are also materials that could be used. Dielectrics that have a dielectric constant less than 4, are often considered as low-k dielectric materials. Moreover, the same solution-based materials as described above for the gate dielectric may be used. Furthermore, the material 108 may be a phase-change material that is deposited in a melted state and which then solidifies after being deposited. A wax such as a stearyl stearamide (Kemamade) is an example and another example are radiation curable gel inks such as the ones disclosed in U.S. Patent Publication No. 2007/0120924, which is hereby incorporated herein by this reference in its entirety. Some radiation curable materials such as UV curable polymers that do not substantially rely on solvent evaporation are also included in the class of phase-change polymer since they are transferred from a liquid state into a solid state upon UV exposure. In at least one form, the positioning of the printed polymer is very accurate and depends on the printhead. Afterwards, in at least one form, the source line or feature 106 is printed so that it only slightly extends over the printed decoupling insulator onto the gate line region 104. A semiconductor 112 is then deposited. The semiconductor may be a solution deposited organic semiconductor such as a polythiophene (e.g. P3HT, PQT-12), or a small-molecule semiconductor deposited from a precursor (e.g. TIPS-pentacene). It may also be a semiconductor based on inorganic nanoparticles such as silicon nanoparticles, CdSe-, CdS-, ZnS-nanoparticles, carbon nanotubes, nanowires (e.g. silicon nanowires) or precursors of inorganic semiconductors. The semiconductor may be also deposited with a non-solution deposition method such as an evaporation method. For example, the semiconductor may be deposited through a shadow mask by thermal evaporation of a material such as pentacene. It should be noted that in the described process the semiconductor is deposited after depositing the source and drain layer 106 and 102, forming a bottom contact thin film transistor. However, the structure should not be limited to this. The semiconducting layer may also be deposited before depositing the source and drain contacts. For example, after depositing the decoupling insulating layer 108, the semiconducting layer may be deposited. Thereafter, the source and drain electrodes are deposited, forming a top contact thin-film transistor. Moreover, the transistor structure may be also a combination of top-contact and bottom contact transistor. For example, the semiconductor may be deposited after depositing the source electrode 102 and before depositing the drain electrode 106.

Figure 4:
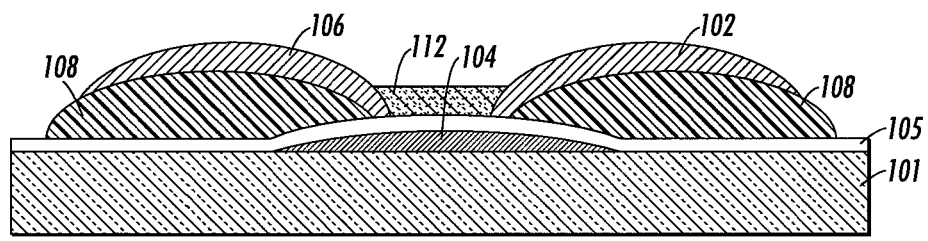

In the previously described structure, which is illustrated in FIG. 3, the decoupling insulating layer 108 is only patterned under part of the drain electrode. However, a similar layer may be also patterned under the source electrode 102. This is illustrated in FIG. 4. In this embodiment, the decoupling insulating layer 108 under the source electrode 102 reduces capacitive coupling between the source electrode 102 and the gate electrode 104. It should be noted, that the decoupling insulating material 108 may be chosen so that the source and/or drain electrode material, when deposited from solution, fluidically pins to this material. If this is the case, the deposition process for the source and/or drain electrode material is quasi-self-aligned. This requires, of course, that the gate dielectric material repels the solution of the deposited source and/or drain electrode material. This may be the case if the gate dielectric or the surface of the gate dielectric has a low surface energy. For example, if the gate dielectric, or part of it, is coated with a layer of a hydrophobic methylated polysilsesquioxane (PSSQ) and the insulator 108 comprises polyvinylphenol (PVP), an aqueous solution of PEDOT:PSS (Clevios from H.C. Starck) will be pinned on the rather hydrophilic PVP and be repelled by the PSSQ surface. See, for example, U.S. application Ser. No. 12/324,304, filed on Nov. 26, 2008, entitled, "An Electronic Circuit Structure and Method for Forming Same," and naming Daniel et al. as inventors and U.S. application Ser. No. 12/324,250, filed on Nov. 26, 2008, entitled "Method and Structure for Establishing Contacts in Thin Film Transistor Devices," naming Daniel et al. as inventors, both of which are incorporated herein by reference.

Although the process described with regard to FIGS. 3(A) and (B) deposits the semiconductor after depositing the gate electrode (bottom gate transistor configuration), in a variation of the process, the semiconducting layer is deposited before depositing the gate electrode (top gate transistor configuration).

Figure 5:
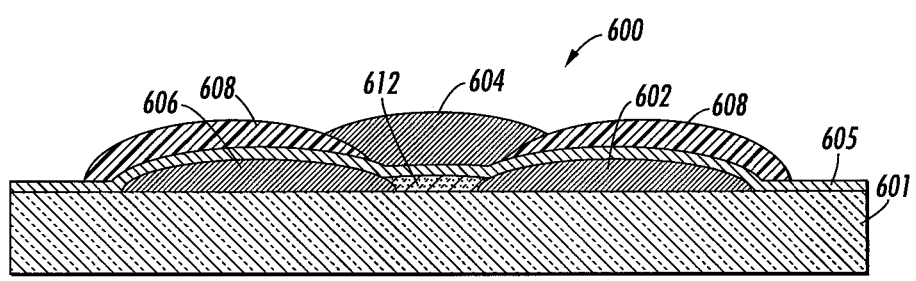
Figure 6:
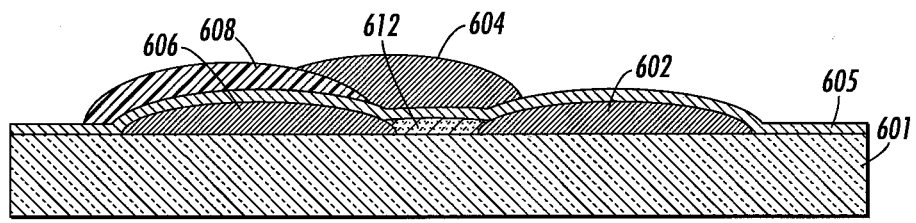

With reference to FIG. 5, a transistor 600 is shown. The transistor 600 is a top gate transistor formed on a substrate 601 to which the presently described embodiments are applied. In this regard, the transistor 600 includes a drain electrode or area 602, a source electrode or area 606 and a gate electrode or area 604. A semiconductor 612 extends between source and drain regions or areas. The semiconductor may be deposited before the source and drain electrodes are deposited or it may be deposited afterwards, resulting in a bottom or top contact top gate TFT. A gate dielectric 605 is formed over source and drain electrode and semiconductor region. In accordance with the presently described embodiments, decoupling insulator portions 608 are formed over at least part of the source and drain electrodes. In this top gate embodiment, the gate 604 is formed between the decoupling insulator portions 608 and over the transistor channel region which is the region between source and drain electrodes. Of course, the addition of the decoupling insulator portions 608 provide the transistor 600 with reduced parasitic capacitance, as explained above in connection with FIG. 3. The overlap capacitance between the gate electrode and source and drain electrodes is reduced. As shown in FIG. 6, the transistor structure may only utilize one decoupling insulator region over at least part of the source or the drain region. In FIG. 6, the decoupling insulator is shown over the drain electrode region. In this case, the gate electrode would be printed so that the overlap with the source electrode region is as small as possible (in order to reduce capacitive coupling).

In this improved printed TFT (in any of the forms shown above), a decoupling insulator, such as a polymer, is strategically deposited by printing, such as jet-printing. The decoupling insulator can be relatively wide, but the overriding aspect is good definition of the edge of the printed line. The printed insulator, which may be a polymer, increases the thickness of the gate dielectric layer and, thus, reduces the capacitive coupling. In this regard, for improved results, a low-k insulator may be used. The insulator may also be chosen to have a wetting property (surface energy) that allows good deposition of the subsequent conducting lines. In one example, the polymer is a crosslinkable polyvinylphenol (PVP) with a water-contact angle between 40 an 70 deg and the printed conductor is a silver nanoparticles solution based on ethyleneglycol and water (Cabot Corp.).

Figure 7:
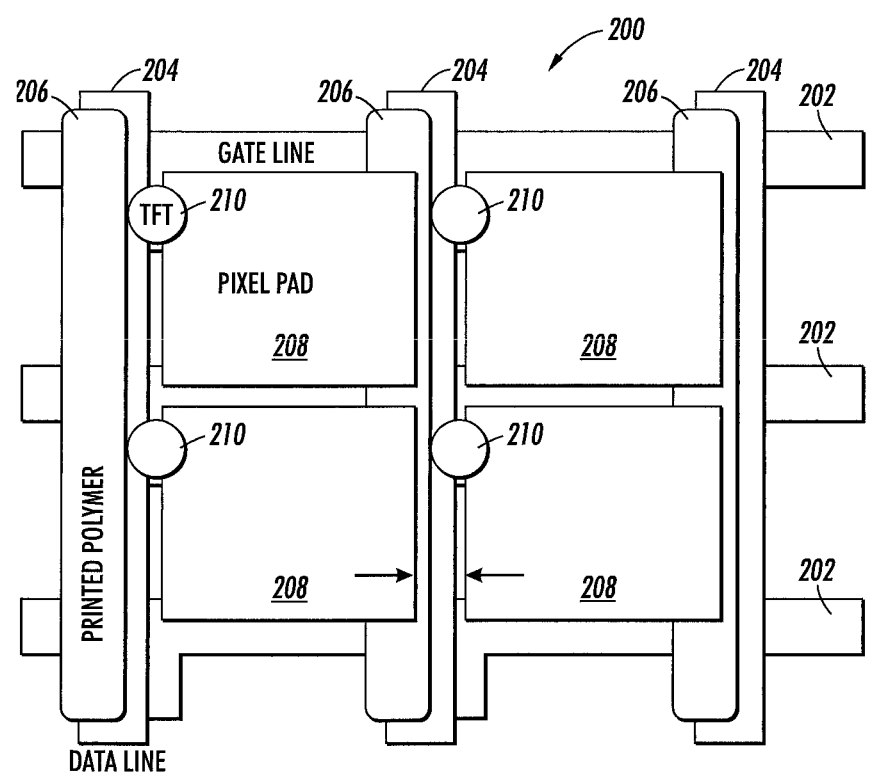
FIG. 7 is a representation of a pixel circuit according to the presently described embodiments.

FIG. 7 illustrates the implementation of a decoupling insulator as applied to active-matrix pixel structures, such as a portion 200 of a pixel array. Gate lines 202 and data or source lines 204 are printed in an array. A polymer or insulating layer or line, such as that shown at 206, is printed partially over the data lines 204 before pixel pads 208 are deposited. The decoupling insulator 206 allows the pixel pads 208 to partially cover the data lines which results in a higher pixel fill factor (ratio of pixel pad area to total pixel area). Usually, the data lines and the pixel pads are deposited on the same level. However, when using printing techniques such as inkjet printing, it is easy to print a different material, such as an insulator, in-between. In that case, first the data lines 204 would be deposited, then the insulating features 206 and then the pixel pads 208. Capacitive coupling between the data lines 204 and the pixel pads is undesirable, therefore the decoupling insulator 206 would have to be relatively thick or/and of an insulator with low dielectric constant k. Also shown are semiconductor pads 210, which may be deposited at the end.

The pixel fill factor is increased because the pixel pads 208 can extend over the data lines 204. The polymer or insulating layer 206 is, in one form, sufficiently thick and, the dielectric constant is preferably low—to avoid feed-through from the data lines 204 to the pixel pad 208. The insulating layer can also serve as a barrier for the semiconductor 210—which is deposited afterwards. Often, the semiconductor 210 tends to spread to a neighboring pixel. The polymer layer may act as a barrier and prevent this from happening. The barrier may be a mechanical barrier which prevents the semiconductor solution from spreading or it may be a low surface energy barrier that repels the semiconductor solution. The pixel pad is shown in FIG. 7 as printed completely after the deposition of the insulator 206. However, the pad may be also printed in two steps in which first a small pad is printed around the same time the data lines are printed, then the insulator 206 is deposited. This insulator layer may even be partially deposited over the small pixel pad area. Afterwards, the second section of the pixel pad is printed partially over the insulating layer 206 and making electrical contact to the small pixel pad.

Figure 8:
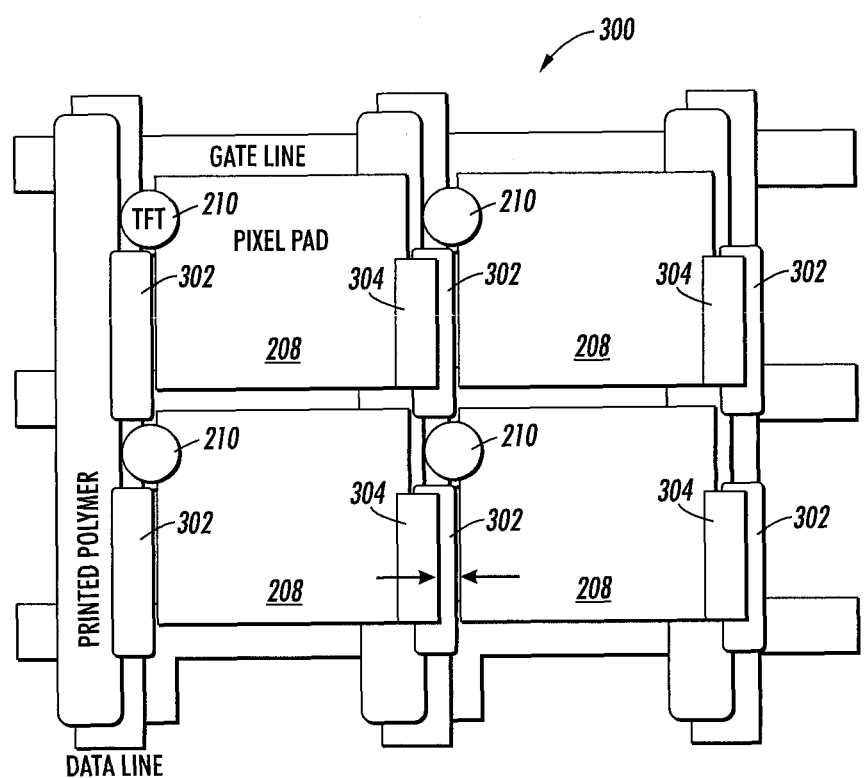
FIG. 8 is a representation of another pixel circuit according to the presently described embodiments.

With reference now to FIG. 8, the fill-factor can be further improved by covering the data lines to a greater extent with an extended insulator or polymer portion. In this regard, a pixel circuit 300 is shown. It is to be appreciated that the pixel circuit 300 is of substantially the same configuration as the pixel circuit 200 of FIG. 7—, with the exception of the following. The pixel circuit 300 includes extensions or additional pads of insulating or polymer material 302. Likewise, the corresponding pixel pad 208 includes an extension or additional electrically conductive material 304. This extension 304 results in improved fill factor for the pixel circuit. The insulating material or polymer 302 may also partially confine the semiconductor 210 and prevent excessive spreading. Excessive spreading otherwise could result in un-gated semiconductor regions. It should be appreciated that the extensions 302 and 304 may be incorporated in the circuit in a variety of manners. For example, the extensions may be applied as a separate step of the fabrication process using the same printing technique as is used for the formation of the insulating layer and/or the pixel pad. Or, the extension may be integrated into the configuration of the insulating layer and/or the pixel pad so that it is printed at the same time.

Figure 9A:
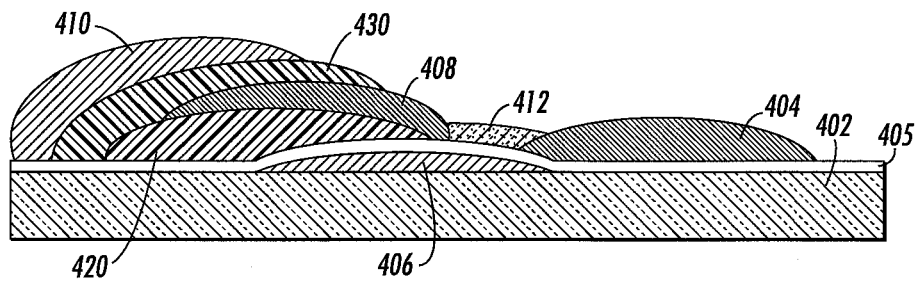
FIG. 9(A) is a cross-sectional view of a thin film transistor incorporated in a pixel circuit according to the presently described embodiments.
Figure 9B:
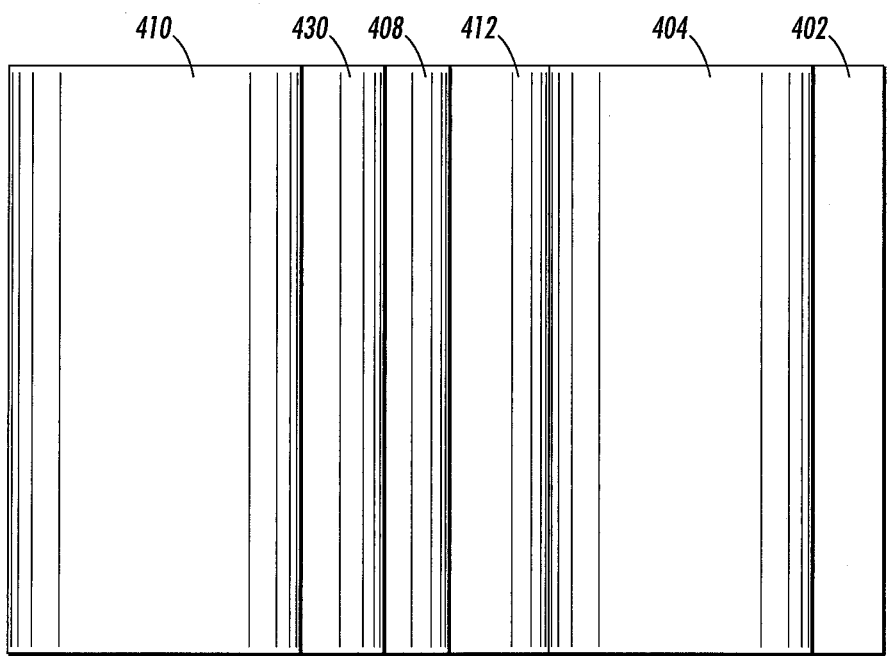
FIG. 9(B) is a top view of the figuration of FIG. 9(A)

FIGS. 9(A) and (B) show a pixel structure 400 for a TFT in which multiple printed insulator layers, e.g. two layers, are used. As shown, the structure 400 includes a substrate 402, a drain 404, a gate 406, a gate dielectric 405, a source 408, a metal layer 410 and a semiconductor 412. Notably, a first insulating layer 420 is disposed between the gate 406 and the source 408. A second insulating layer 430 is disposed between the source 408 and the metal layer 410. Of course, these insulating layers may take a variety of forms, including that of a polymer material. It should also be appreciated that the number of insulating layers could vary. Each insulator layer may also comprise a double layer. For example, a lower thicker layer with a low dielectric constant to reduce capacitive decoupling and an upper layer to provide an optimized surface with a surface energy that is compatible with the printing of the conducting lines. Such structure may be achieved by first printing a layer of polyvinylcinnamate and then a thin layer of polyvinylphenol on top, for example. In this example, polyvinylcinnamate would provide the low-dielectric constant layer and polyvinylphenol (which has a higher dielectric constant) would provide a surface onto which silver lines can be printed very reliably. Such a double insulator structure may be also achieved by printing a blend of polymers and relying on phase separation to let rise one polymer to the top during drying.

Figure 10:
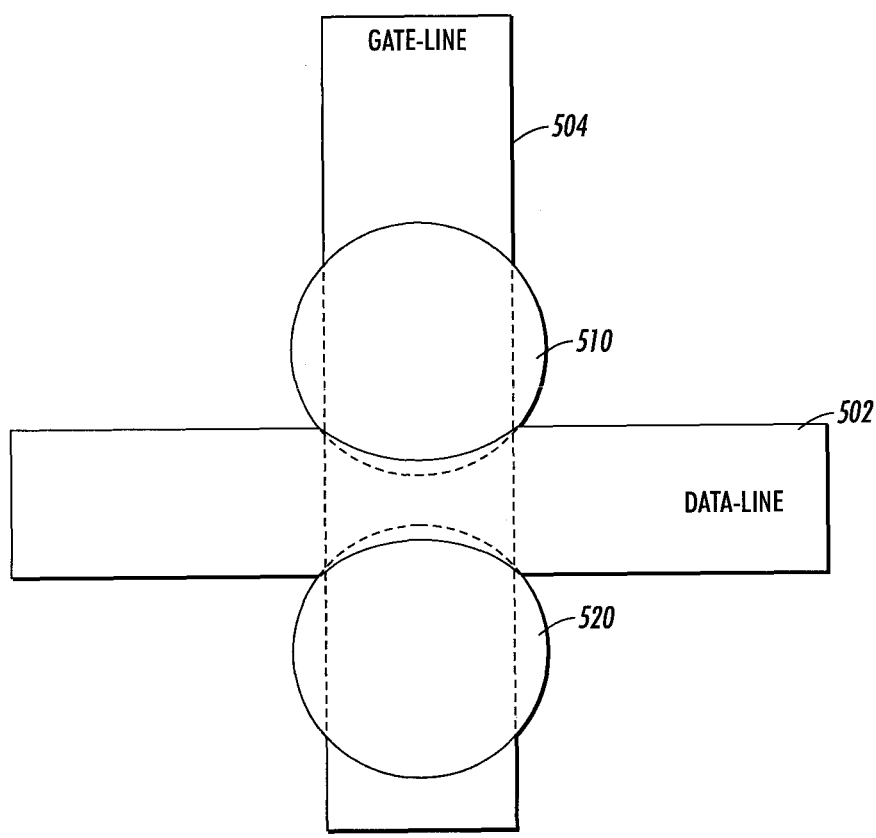
FIG. 10 is a top view of an optional feature of the presently described embodiments.

FIG. 10 illustrates an application of the presently described embodiments for reducing the cross-over capacitance between two crossing conductor lines (separated by a thin insulating layer) by printing two thicker insulating or polymer areas before depositing the upper line. As shown, (data) line 502 intersects (gate) line 504. Insulating or polymer pads 510 and 520 are printed as shown and may be formed as drops having a rounded surface. The data line 502 becomes effectively more narrow as it settles between the drops 510 and 520. This is because the two areas 510 and 520 form a structural barrier for the ink of the data-line or the two areas 510 and 520 may also comprise a material that repels the ink. Of course, the insulating or polymer layer 510 or 520 could be a continuous area at the cross-over point, but having two opposing areas may lower the risk of line-breakup during printing.

The presently described embodiments are described using printing techniques, in particularly inkjet printing (e.g. piezo, thermal, continuous or electrostatic inkjet). However, it equally applies to other printing or deposition techniques, such as, dip-pen-like printing methods (e.g. Nanoink, Inc.) or aerosol printing (Optomec, Inc.).

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A thin film transistor comprising:
   a substrate;
   a source pattern and a drain pattern with a semiconductor positioned between the source pattern and the drain pattern on the substrate;
   a dielectric layer formed over the source and drain electrode patterns and the semiconductor;
   a decoupling insulating pattern formed over at least portions of the drain and source patterns; and,
   a gate electrode pattern between the source pattern, the drain pattern, the semiconductor and the decoupling insulating pattern,
   wherein the decoupling insulating pattern narrows a region where the gate electrode pattern and the source or drain electrode pattern are separated by only the dielectric layer.

2. The transistor as set forth in claim 1 wherein the gate pattern is printed.

3. The transistor as set forth in claim 1 wherein the source pattern is printed.

4. The transistor as set forth in claim 1 wherein the drain pattern is printed.

5. The transistor as set forth in claim 1 wherein the decoupling insulating pattern is printed.

6. The transistor as set forth in claim 1 wherein the decoupling insulating pattern comprises at least one of an SU-8 material, polyvinylphenol (PVP), a low dielectric constant material, a phase-change material, stearyl stearamide, radiation curable gel inks, radiation curable polymers, polymer dielectrics, and composite dielectrics.

7. The transistor as set forth in claim 1 wherein the decoupling insulating pattern reduces parasitic capacitance between the gate electrode pattern and the source or drain electrode pattern.

* * * * *